United States Patent
Mine

(10) Patent No.: US 9,608,534 B2
(45) Date of Patent: Mar. 28, 2017

(54) POWER CONVERSION SYSTEM, AND VOLTAGE DETECTION DEVICE THEREOF

(71) Applicant: FUJI ELECTRIC CO., LTD., Kawasaki-shi (JP)

(72) Inventor: Hironori Mine, Hachioji (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 224 days.

(21) Appl. No.: 14/478,358

(22) Filed: Sep. 5, 2014

(65) Prior Publication Data

US 2014/0376282 A1 Dec. 25, 2014

Related U.S. Application Data

(63) Continuation of application No. PCT/JP2013/061270, filed on Apr. 16, 2013.

(30) Foreign Application Priority Data

Jun. 6, 2012 (JP) .................................. 2012-129267

(51) Int. Cl.
*H02M 1/32* (2007.01)
*H02M 5/458* (2006.01)
(Continued)

(52) U.S. Cl.
CPC ........... *H02M 5/4585* (2013.01); *H02M 1/32* (2013.01); *H02P 29/0241* (2016.02);
(Continued)

(58) Field of Classification Search
CPC ...... H02M 5/40; H02M 5/4585; H02M 5/458; H02M 7/217; H02M 7/2176
(Continued)

(56) References Cited

U.S. PATENT DOCUMENTS

| 6,075,328 A * | 6/2000 | Notohara ............... H02M 5/458 318/400.01 |
| 7,619,402 B1 * | 11/2009 | Kwong ................... G05F 1/575 323/297 |
| 2006/0126367 A1 * | 6/2006 | Hesterman ........ H02M 3/33507 363/89 |

FOREIGN PATENT DOCUMENTS

| JP | 2004-177208 A | 6/2004 |
| JP | 2006-304414 A | 11/2006 |

(Continued)

OTHER PUBLICATIONS

Michael Stutz, All about circuits, 1999-2000, Design Science License http://www.allaboutcircuits.com/textbook/direct-current/chpt-7/analysis-technique/.*

(Continued)

*Primary Examiner* — Timothy J Dole
*Assistant Examiner* — Bryan R Perez
(74) *Attorney, Agent, or Firm* — Rossi, Kimms & McDowell LLP

(57) ABSTRACT

A detection target voltage is divided by a voltage divider circuit wherein a large number of resistor circuits, each of which is formed by a plurality of resistors being connected in parallel, are connected in series, and the voltage is detected. The output of a multiple voltage detector circuit formed of an operational amplifier, and the like, connected to three arbitrary places in the voltage divider circuit is input into a CPU twice, when the switch is in an on-state and when it is in an off-state. The CPU, based on the two measured voltages, can determine that trouble has occurred when there is, for example, trouble such as a short circuit or disconnection of a resistor of the resistor circuits related to the places connected to the three places in the voltage divider circuit.

10 Claims, 5 Drawing Sheets

(51) Int. Cl.
    *H02M 5/44*          (2006.01)
    *H02M 1/00*          (2006.01)
    *G01R 31/42*         (2006.01)
    *H01M 10/42*        (2006.01)
    *H02P 27/06*         (2006.01)

(52) U.S. Cl.
    CPC ..... *G01R 31/42* (2013.01); *H01M 2010/4271* (2013.01); *H01M 2220/20* (2013.01); *H02M 5/44* (2013.01); *H02M 2001/0025* (2013.01); *H02P 27/06* (2013.01)

(58) Field of Classification Search
    USPC ... 363/35–37, 135, 136, 137, 40, 41, 43, 55, 363/65, 71, 72, 95, 97, 98, 131, 132; 323/297, 298, 353, 354
    See application file for complete search history.

(56) References Cited

FOREIGN PATENT DOCUMENTS

| | | |
|---|---|---|
| JP | 3902030 B2 | 4/2007 |
| JP | 2010-008227 A | 1/2010 |
| JP | 2010-288358 A | 12/2010 |
| JP | 2011-232171 A | 11/2011 |

OTHER PUBLICATIONS

International Search Report issued in PCT/JP2013/061270 mailed May 21, 2013.

\* cited by examiner

POWER CONVERSION SYSTEM, AND VOLTAGE DETECTION DEVICE THEREOF

CROSS-REFERENCE TO RELATED APPLICATIONS

This application is a continuation of International Application No. PCT/JP2013/061270, filed on Apr. 16, 2013, which is based on and claims priority to Japanese Patent Application No. JP 2012-129267, filed on Jun. 6, 2012. The disclosure of the Japanese priority application and the PCT application in their entirety, including the drawings, claims, and the specification thereof, are incorporated herein by reference.

BACKGROUND

1. Field of the Invention

The present invention relates to a power conversion system.

2. Related Art

A motor drive device that controls the drive of a machine or the like utilizes an alternating current power supply (a commercial power supply or the like), a direct current power supply (a battery or the like), or the like, as a power input source. Furthermore, in order to increase the power utilization efficiency, the motor drive device may have a function of returning power generated in the motor when applying a brake to the action of the machine or the like (regenerative power) to the input source.

There is known a power conversion system that, in order to drive, or the like, some load, generates direct current power from an alternating current/direct current power supply, converts the direct current power into alternating current power, and has a function of returning regenerative power to the power supply side, the heretofore described motor drive device being one example, although this example is not limiting.

A power conversion system used in the heretofore described motor drive device, or the like, has a converter unit and an inverter unit. The converter unit generates an arbitrary direct current power based on the input power source, and provides the direct current power to the inverter unit. Herein, as the converter unit is compatible with a regenerative operation, it can cause alternating current power or direct current power to flow in either direction between the converter unit and input power source. That is, in the case of an alternating current power supply, the converter unit can cause alternating current power to flow in either direction between the converter unit and input power source. In the case of a direct current power supply such as a battery, the converter unit can cause direct current power to flow in either direction between the converter unit and input power source.

The inverter unit converts the direct current voltage generated by the converter unit into alternating current power of an arbitrary frequency and voltage, and carries out a drive or braking operation of the motor.

The converter unit controls the voltage value of the direct current voltage that is the output thereof. That is, the value is maintained so that the output voltage does not drop due to causing power from the input power source to flow to the inverter side when the inverter unit drives the motor. Also, the value is maintained so that the output voltage does not rise due to causing regenerative power from the inverter side to flow to the input power source when the inverter unit applies a brake to the motor. Control of these operations of the converter unit is normally implemented by a control unit, or the like, thereof reading a voltage value called a "direct current intermediate voltage", or the like, using a voltage detector.

The "direct current intermediate voltage" means the direct current voltage between the inverter unit and converter unit (the voltage applied to a smoothing capacitor, or the like, provided between the inverter unit and converter unit). It may be supposed that the "direct current intermediate voltage" corresponds to the output voltage of the converter unit.

Also, there is heretofore known technology disclosed in, for example, Japanese Patent Application Publication No. JP-A-2010-8227 (also referred to herein as "PTL 1").

The invention of PTL 1 is an invention such that the voltage of a battery unit is detected without increasing power consumption due to leakage current, and with a reduction in part cost. A voltage detector circuit that detects the voltage of a battery unit configuring a high voltage battery includes a resistance divider circuit, switching elements, an A/D converter that converts voltage divided by the resistance divider circuit, or the like, into a digital signal, an operation circuit, and the like. Further, for example, by each switching element being switched to on or off, or the like, the voltage of each connection point in the battery unit is caused to be input into the A/D converter in temporal sequence.

Herein, the power conversion system converter unit compatible with the regenerative operation also includes, for example, switching elements such as IGBTs, and also includes a control unit, or the like, that controls the switching on and off (PWM control) of the switching elements. In particular, in the case of this kind of power conversion system having IGBTs or the like, the following problem occurs.

That is, when a failure occurs in the voltage detector that detects the "direct current intermediate voltage" (output voltage), particularly when a detected value lower than the actual voltage value is output, the converter unit attempts to maintain the output voltage at the target value, because of which an output voltage that is actually higher than the target value is generated. For example, when the value detected by the voltage detector (in which a failure is occurring) is 70V, despite the actual value being 100V, with a setting that maintains the output voltage at 100V, the converter unit may generate the actual output voltage value in the region of, for example, 130V.

When the value of the converter unit output voltage exceeds the breakdown voltage of "the IGBTs that are the switching elements configuring the converter unit and inverter unit" due to this kind of voltage detector failure, the elements are destroyed, causing serious damage to the power conversion system.

The invention of PTL 1 is such that no failure in the voltage detector circuit itself is envisaged, and of course, absolutely no consideration is given to detecting a failure in the voltage detector circuit itself.

SUMMARY OF THE INVENTION

An object of the invention is to provide a power conversion system, a voltage detection device thereof, and the like, such that it is possible to prevent a situation wherein an element is destroyed in the power conversion system. As means thereof, even when there is a failure in a voltage detection device that detects the output voltage value of a converter unit of the power conversion system, immediate detection of the failure is enabled with a simple configuration.

A power conversion system of the invention has a converter that generates direct current power from a power supply, an inverter that drives a load based on the direct current power, and a voltage detection device that detects the voltage value of a direct current intermediate voltage between the converter and inverter, and has the following configurations.

That is, the voltage detection device has the following configuration. A voltage divider circuit, wherein the direct current intermediate voltage is applied, a plurality of resistor circuits in which a plurality of resistors are connected in parallel are connected in series, and the direct current intermediate voltage is divided by the plurality of resistor circuits. A multiple voltage detector circuit, connected to a plurality of arbitrary places in the voltage divider circuit, that can selectively output a plurality of kinds of voltage value in accordance with the voltage of the plurality of places in the voltage divider circuit. Trouble determination means that, based on the plurality of kinds of voltage value output in temporal sequence from the multiple voltage detector circuit and on a preset predetermined value, carries out trouble determination for the voltage detector device. Direct current intermediate voltage value detection means that, when it is determined by the trouble determination means that conditions are normal, obtains the direct current intermediate voltage value using one of the plurality of kinds of voltage value.

DETAILED DESCRIPTION

Figure 1:
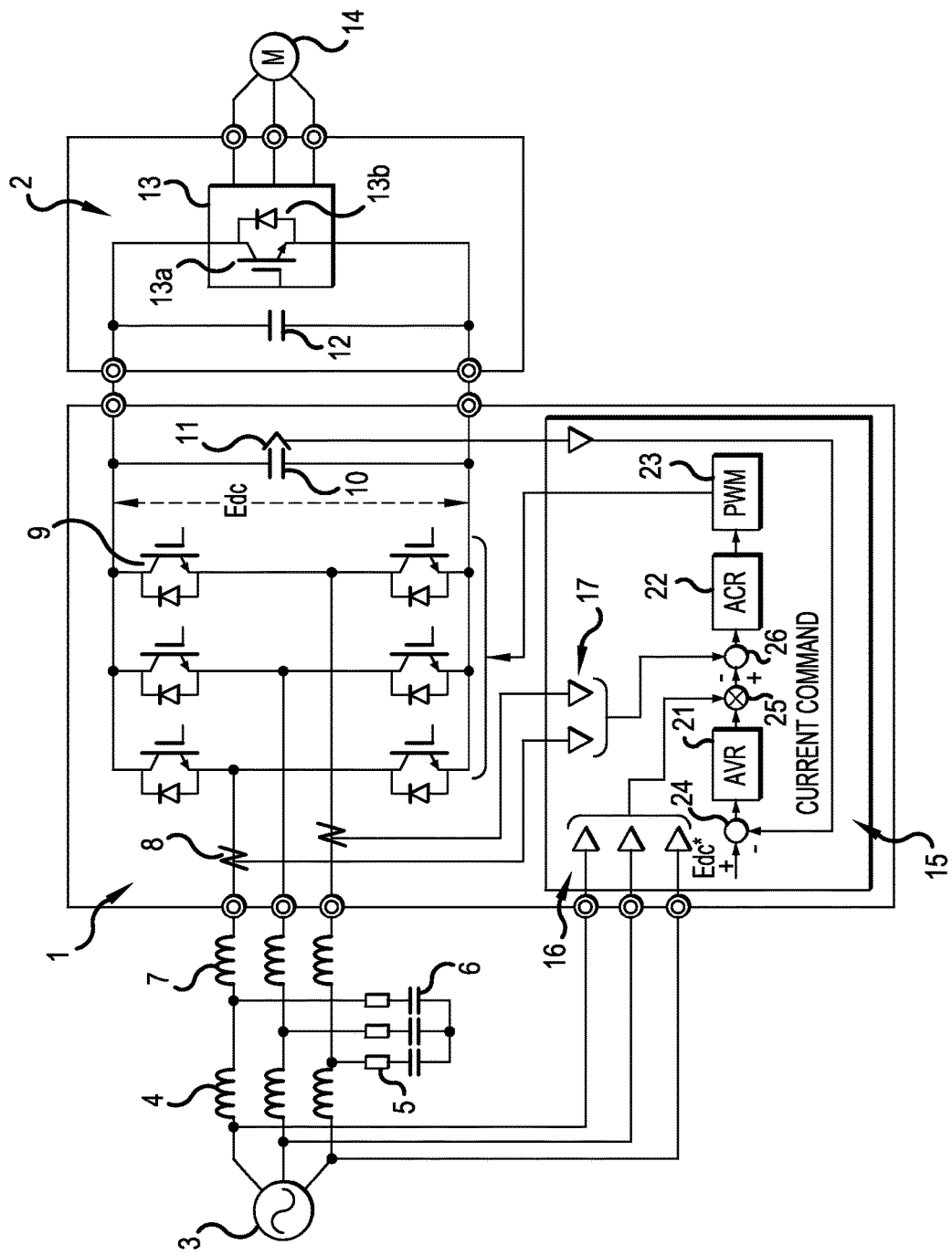
FIG. 1 is a configuration diagram of a power conversion system of the embodiment.

Hereafter, referring to the drawings, a description will be given of an embodiment of the invention.

FIG. 1 is a configuration diagram of a power conversion system of the embodiment.

In the embodiment, an example wherein the input power supply is a 3-phase alternating current power supply is shown, but of course, this kind of example not being limiting, the input power supply may also be a direct current power supply. Also, the power conversion system of the example is applied to, for example, an automobile, a crane, an elevator, a train, motor drive equipment in a factory, or the like, but these examples are, of course, not limiting. Also, the drive target (load) of the power conversion system of the embodiment is an electric motor 14 in the example shown in the drawing, but this example is not limiting. Also, it is assumed that the power conversion system of the embodiment, basically, has a switching element such as an IGBT 9 in a converter thereof, and is such that boosting and a regenerating operation (returning regenerative power to the power supply side) are possible.

The power conversion system of the embodiment has a converter 1 (for example, a PWM converter), which generates direct current power from an AC/DC power supply and supplies the direct current power to an inverter 2, and the inverter 2 (for example, a PWM inverter or VVVF inverter), which drives a load (the motor 14 or the like) based on the direct current power.

The above-mentioned PWM is an abbreviation of "pulse width modulation", while the above-mentioned VVVF is an abbreviation of "variable voltage variable frequency".

Furthermore, the power conversion system of the embodiment has a direct current intermediate voltage detection device that detects the value of voltage between the PWM converter 1 and inverter 2 (the above-mentioned "direct current intermediate voltage"). The direct current intermediate voltage detection device is formed of, for example, a direct current intermediate voltage detector 11 and a control unit 15 (CPU 37). Herein, the direct current intermediate voltage detection device of the embodiment not only detects the voltage value of the direct current intermediate voltage, but also has a function of determining whether or not there is trouble in the device itself (the direct current intermediate voltage detector 11 thereof). A configuration and process for this purpose are shown in FIG. 2 to FIG. 5, and will be described hereafter.

The direct current intermediate voltage detection device can be seen as being one portion of the converter 1, or can be seen as being a separate configuration for controlling the converter 1.

As the input power supply of the power conversion system in the embodiment is a 3-phase alternating current power supply, as heretofore described, a 3-phase alternating current power supply 3 is connected to the converter 1. With regard to this connection, a filtering reactor 4 and a boosting reactor 7 are inserted between the 3-phase alternating current power supply 3 and PWM converter 1 in each phase, as shown in the drawing. Also, a series circuit of a filtering resistor 5 and filtering capacitor 6 is connected in a star connection to each line (to each phase) of the 3-phase alternating current power supply between the filtering reactor 4 and boosting reactor 7. As the actions of these reactors, capacitors, and the like, are of no particular relevance here, no description will be given thereof, the description being limited to the fact that the 3-phase alternating current power supply 3 is connected to the converter 1.

The PWM converter 1 converts 3-phase alternating current power into direct current power and vice versa. That is, the PWM converter 1 converts 3-phase alternating current power from the 3-phase alternating current power supply 3 into direct current power. The direct current power is supplied to the inverter 2.

Also, the PWM converter 1 converts direct current power into 3-phase alternating current power, and supplies the 3-phase alternating current power to the 3-phase alternating current power supply 3. As is well known, this returns regenerative power generated in accompaniment to a braking operation, or the like, of the motor 14 to the input power supply.

The PWM converter 1 is connected to the inverter 2 by a direct current voltage line. The inverter 2 carries out driving and braking of the motor 14 by generating an alternating current voltage of arbitrary voltage and frequency based on the direct current power supplied from the PWM converter 1.

When driving the motor 14, active power flows as driving power from the 3-phase alternating current power supply 3 via the PWM converter 1 and inverter 2 to the motor 14. When braking the motor 14, active power flows as regenerative power from the motor 14 via the inverter 2 and PWM converter 1 to the 3-phase alternating current power supply 3.

As heretofore described, the PWM converter 1 receives a supply of alternating current power from the 3-phase alternating current power supply 3 and converts the alternating current power into direct current power, and also converts regenerative power (direct current power) from the motor 14 side into alternating current power, and supplies the alternating current power to the 3-phase alternating current power supply 3.

The PWM converter 1 is configured of a main circuit unit, the control unit 15, which controls switching (controls the turning on and off) of each IGBT 9, a direct current intermediate voltage capacitor 10, the direct current intermediate voltage detector 11, and the like. The main circuit unit is configured by a series connection circuit of the IGBT (insulated gate bipolar transistor) 9 being provided in each of the three phases (therefore, the main circuit unit is configured of six of the IGBT 9 in the example shown in the drawing).

The main circuit unit may be seen as being the PWM converter 1 (converter main body and the like) in a strict sense. Because of this, the direct current voltage between the PWM converter 1 and inverter 2 (the direct current intermediate voltage) may be seen as being the direct current voltage between the main circuit unit and inverter 2, and in particular, may be seen as being the voltage applied to the direct current intermediate voltage capacitor 10.

Also, it can be said that the control unit 15, while carrying out conversion of alternating current into direct current and vice versa, boosting, and the like, by controlling the converter main body, controls so as to maintain, for example, a "direct current intermediate voltage" Edc at a target value. The control unit 15 carries out the control based on the value of the "direct current intermediate voltage" Edc detected by the direct current intermediate voltage detector 11.

The direct current intermediate voltage detector 11 detects the value of the voltage (the "direct current intermediate voltage" Edc; this is the direct current voltage between the PWM converter 1 and inverter 2, and the PWM converter 1 controls the value thereof) across the direct current intermediate voltage capacitor 10 (a smoothing capacitor or the like). Power conversion of the 3-phase alternating current and direct current is carried out by the turning on and off of each IGBT 9 being controlled by the control unit 15.

As the configuration of the main circuit unit, not only are there the IGBTs 9, but furthermore, as shown in the drawing, a diode is connected in parallel with each IGBT 9, but no detailed reference will be made to the diode.

The control unit 15 carries out control of the turning on and off of each IGBT 9 based on the voltage value of the "direct current intermediate voltage" Edc detected by the direct current intermediate voltage detector 11, and the like. The PWM converter 1 converts 3-phase alternating current voltage into direct current voltage when the motor 14 is being driven. At this time, the control unit 15 of the PWM converter 1 controls the turning on and off of each IGBT 9 so that the value of the direct current voltage, that is, the voltage (Edc) across the direct current intermediate voltage capacitor 10, is a voltage the same as a commanded voltage value (Edc*).

Herein, when a voltage value particularly lower than the actual value is input into the control unit 15 as a detected value during the heretofore described control due to trouble in the direct current intermediate voltage detector 11, a heretofore known problem occurs. That is, the output voltage (Edc) from the PWM converter 1 to the inverter 2 becomes abnormally higher than the command voltage value Edc*, and in some cases, there is a possibility of this leading to element destruction of each IGBT 9, or element destruction of IGBTs of an IGBT series connection circuit 13, to be described hereafter.

Figure 2:
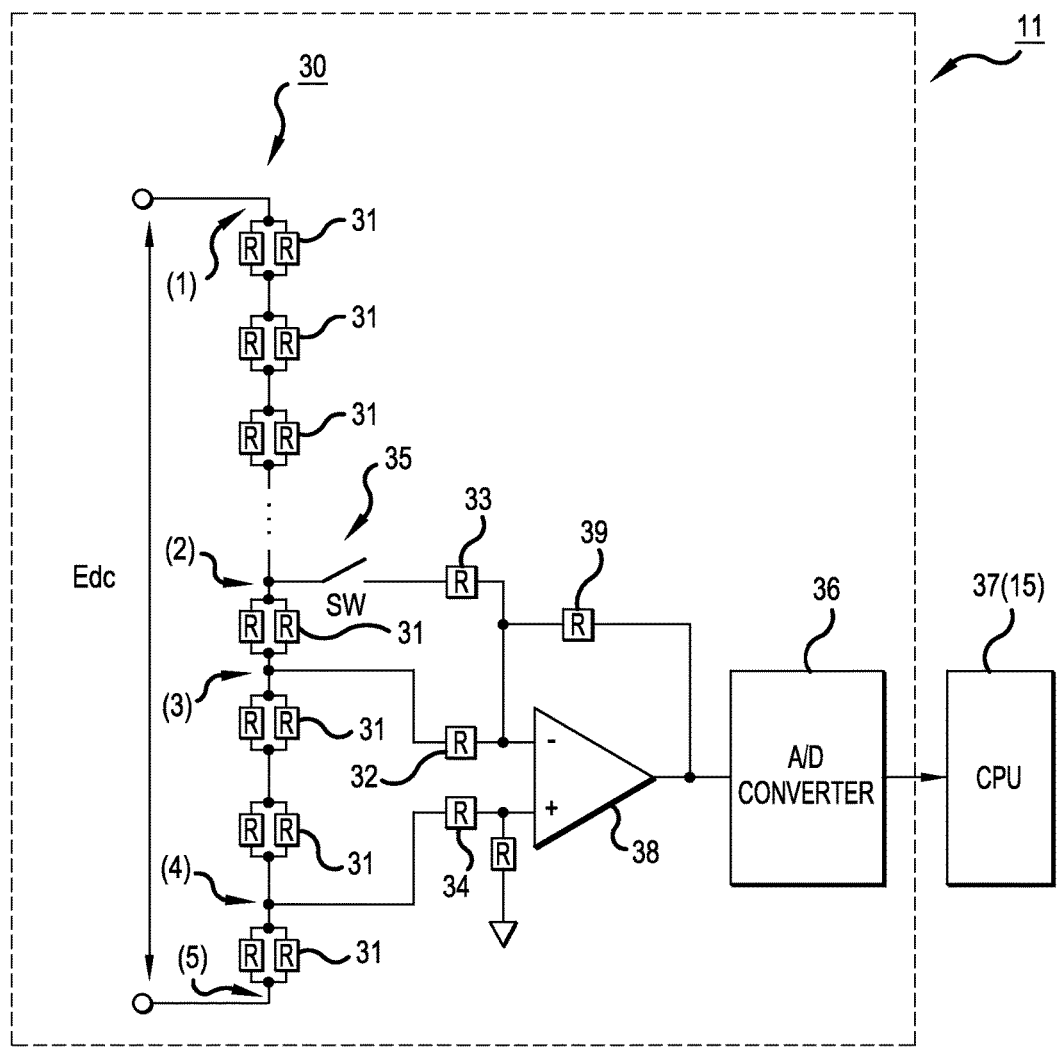
FIG. 2 is a configuration example of a direct current intermediate voltage detector.
Figure 3:
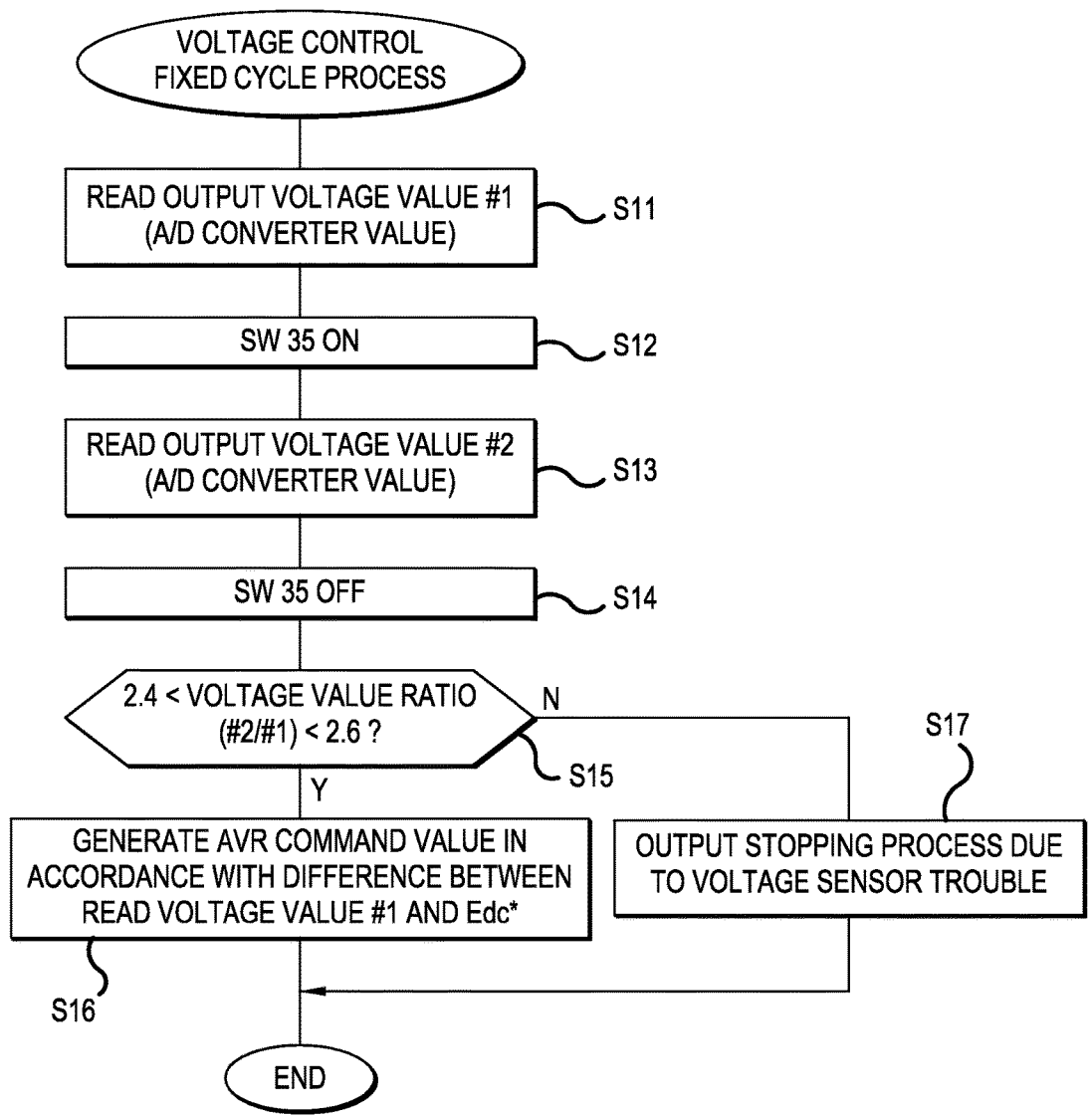
FIG. 3 is a process flow chart of a control unit.

In response to this problem, this method is such that trouble (failure) of the direct current intermediate voltage detector 11 can be detected immediately with, for example, the simple configuration shown in FIG. 2 and the simple process shown in FIG. 3. This will be described hereafter, referring to FIG. 2 and FIG. 3. This example not being limiting, however, trouble (failure) of the direct current intermediate voltage detector 11 can be detected immediately with, for example, the simple configuration shown in FIG. 4 and the simple process shown in FIG. 5. In either case, a description of FIG. 2 and onward will be given hereafter, and the description of the configuration of FIG. 1 will be continued here.

The control unit 15 of the PWM converter 1 is configured of a voltage control unit (AVR) 21, current control unit (ACR) 22, gate pulse generation unit (PWM) 23, all shown in the drawing, and the like. Further, the control unit 15 controls so that the voltage across the direct current intermediate voltage capacitor 10 (the "direct current intermediate voltage" Edc) is the same as the command value (Edc*). The command value (Edc*) is input into the control unit 15 from, for example, an unshown upstream device.

The voltage value (Edc detected value) detected by the direct current intermediate voltage detector 11 is compared with the voltage command value (Edc*) by an adder-subtractor 24 (addition/subtraction), and the voltage control unit (AVR) 21 outputs a current command based on the difference, or the like, between the two. That is, when the detected value (Edc) is lower than the command value (Edc*), the voltage control unit (AVR) 21 outputs a current command such that current is caused to flow from the PWM converter 1 to the inverter 2. When the detected value (Edc) is higher than the command value (Edc*), the voltage control unit (AVR) 21 outputs a current command such that current is caused to flow from the PWM converter 1 to the 3-phase alternating current power supply 3 side.

The current command value output from the voltage control unit (AVR) 21 is such that an output current phase is corrected in a multiplier 25 in accordance with "3-phase alternating current power supply 3 side voltage phase information from a 3-phase voltage phase detection unit 16". The difference between the output of the multiplier 25 and a PWM converter 1 detected current value from a phase current detection unit 8 is obtained in an adder-subtractor 26, and input into the current control unit (ACR) 22. The detected current value from the phase current detection unit 8 (a current sensor or the like) is obtained via a detector 17 shown in the drawing.

The gate pulse generation unit (PWM) 23 generates and outputs a switching pulse in accordance with a voltage vector command output from the current control unit (ACR) 22. The turning on and off (switching) of each IGBT 9 of the PWM converter 1 (the main circuit unit thereof) is controlled in accordance with the switching pulse.

According to the heretofore described operations, the PWM converter 1 is such that current direction and current value are controlled so that the voltage applied to the direct current intermediate voltage capacitor 10 (the "direct current intermediate voltage" Edc) is kept constant. No particular description will be given of detailed operations of the voltage control unit (AVR) 21, current control unit (ACR) 22, and gate pulse generation unit (PWM) 23 (as they are existing configurations).

This completes the description of the PWM converter 1.

Also, the inverter 2 is configured of an input direct current capacitor 12, three IGBT series connection circuits 13, and the like, generates alternating current power of an arbitrary voltage and frequency based on the direct current power generated by the PWM converter 1, and drives the motor 14.

The IGBT series connection circuit 13, although shown with one portion omitted in the drawing, is of a configuration wherein two IGBTs 13a are connected in series. Also, although not all shown in the drawing, three of the IGBT series connection circuit 13 exist, as heretofore mentioned. The configuration is such that, for example, the three IGBT series connection circuits 13 are connected in parallel, in practically the same way as in the PWM converter 1. Also, in the inverter 2 too, a diode 13b is connected in parallel with each IGBT 13a, as shown in the drawing, but no detailed description will be given of the diode, as is the case for the PWM converter 1.

Also, a control unit of the inverter 2 is omitted from FIG. 1, and a description of an operation thereof will also be omitted. The inverter 2 is, for example, a PWM control method regenerative inverter using IGBT elements, wherein control and operation themselves thereof may be existing, common control and operation.

This method is such that, for example, even when trouble (failure) occurs in the direct current intermediate voltage detector 11 in the kind of power conversion device with the configuration of FIG. 1, a configuration and process such that trouble detection is immediately possible are realized with the direct current intermediate voltage detector 11 itself and the control unit 15. As heretofore mentioned, this is realized with a simple configuration and a simple process.

FIG. 2 is a configuration example of the direct current intermediate voltage detector 11.

FIG. 3 is a process flow chart of the control unit 15.

Hereafter, referring to FIG. 2 and FIG. 3, a description will be given of an example but, this example not being limiting, the configuration and process of the modification example shown in FIG. 4 and FIG. 5, for example, may also be adopted. A description of FIG. 4 and FIG. 5 will be given hereafter. Also, as no detailed reference is made to an output "inversion" in the following description, it will be omitted from the description.

Firstly, referring to FIG. 2, a description will be given of a configuration of the direct current intermediate voltage detector 11.

The direct current intermediate voltage detector 11 is formed of a voltage divider circuit 30, a multiple voltage detector circuit (formed of an operational amplifier 38 and the like), an A/D converter 36, and the like, but may be seen as further including the CPU 37. The CPU 37 is of a configuration corresponding to that of the control unit 15 (or to one portion thereof). Hereafter, a description will be given of each configuration in order.

The direct current intermediate voltage detector 11, firstly, includes the voltage divider circuit 30, which is formed of a plurality (a large number) of resistor circuits 31 connected in series. The two ends ((1) and (5) in the drawing) of the voltage divider circuit 30 are connected to the two ends of the direct current intermediate voltage capacitor 10. That is, the voltage across the direct current intermediate voltage capacitor 10 (the direct current intermediate voltage Edc) is applied to the voltage divider circuit 30. The direct current intermediate voltage (Edc) is broken up (divided) by the large number of resistor circuits 31. For example, when the resistance value of all the resistor circuits 31 is the same, Edc is provisionally 100(V), and there are 100 resistor circuits 31, the voltage across each resistor circuit 31 (the divided voltage) is 1(V).

As the direct current intermediate voltage (Edc) is normally a high voltage, this is divided into low voltage by the plurality of resistors (resistor circuits 31), and detection of the direct current intermediate voltage (Edc) is carried out based on the divided voltage.

Generally thinking, the detected value of the direct current intermediate voltage (Edc) can be calculated by the voltage across one arbitrary resistor circuit 31 being detected by an operational amplifier or the like, and the result of the detection being multiplied by the number of resistor circuits 31. With the heretofore described example, when 1.01(V) is detected as the voltage across one arbitrary resistor circuit 31, a detected value of the direct current intermediate voltage (Edc) of 101(V) is calculated by 1.01(V) being multiplied by 100.

As opposed to this, this method adopts, for example, the configuration shown in FIG. 2.

Firstly, each resistor circuit 31 is of a configuration wherein a plurality of resistors are connected in parallel. In the example shown in the drawing, each resistor circuit 31 is of a configuration wherein two resistors R are connected in parallel but, this example not being limiting, a configuration wherein three resistors are connected in parallel, a configuration wherein four resistors are connected in parallel, or the like, may be adopted. This means, however, that the number of resistors R increases commensurately. Furthermore, the amount of change in "ratio" or "difference" when a resistor R is short-circuited or disconnected is small, and it is thus necessary to increase the accuracy of trouble determination commensurately. Therefore, a configuration of the resistor circuit 31 wherein two resistors R are connected in parallel, as shown in the drawing, is desirable.

Figure 4:
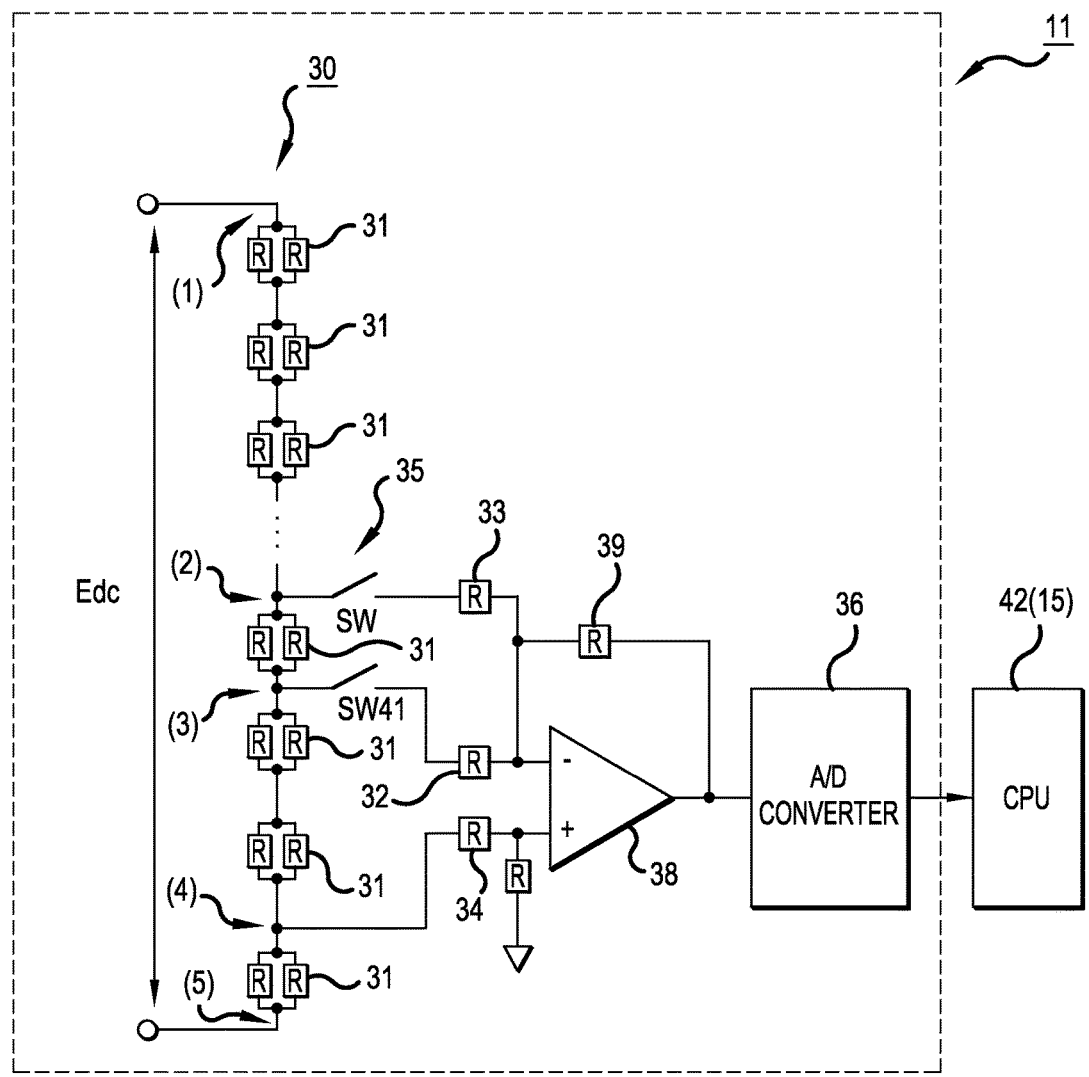
FIG. 4 is a configuration example (modification example) of the direct current intermediate voltage detector.

As previously mentioned, the configurations shown in FIG. 2 and FIG. 4 are not limiting, but when considering the merit of being able to realize with a simple configuration, it is desirable to adopt a configuration wherein each resistor circuit 31 has two resistors, and furthermore, trouble determination is carried out based on two kinds of output voltage value.

Also, the multiple voltage detector circuit, which is connected to the voltage divider circuit 30, is provided.

The multiple voltage detector circuit is formed of the operational amplifier 38, various resistors (input resistors 32, 33, and 34 and a feedback resistor 39), a switch (SW) 35, and the like.

The multiple voltage detector circuit is connected to two arbitrary points (a connection point (3) and a connection point (4) shown in the drawing) in the voltage divider circuit 30, and furthermore, is connected to another arbitrary point (a connection point (2) shown in the drawing) via the switch (SW) 35.

That is, the connection point (4) shown in the drawing is connected via the input resistor 34 to a positive input terminal of the operational amplifier 38. The connection point (3) shown in the drawing is connected via the input resistor 32 to a negative input terminal of the operational amplifier 38. The connection point (2) shown in the drawing is connected via the switch (SW) 35 and input resistor 33 to the negative input terminal of the operational amplifier 38.

When the switch (SW) 35 is in an off-state, the multiple voltage detector circuit operates as an operational amplifier circuit that detects the voltage between the above-mentioned two points (between the connection point (3) and connection point (4)). Herein, a description will be given assuming that the operational amplifier circuit (adder-subtractor circuit) is such that the amplification rate is 100%, but this example is, of course, not limiting. In any case, when the switch (SW) 35 is in an off-state, the multiple voltage detector circuit generates and outputs an output voltage in accordance with the voltage between the two arbitrary points in the voltage divider circuit 30 (between the connection point (3) and connection point (4)). The output voltage of the multiple voltage detector circuit is A/D (analog to digital) converted in the A/D converter 36, and input into the CPU 37.

Also, when the switch (SW) 35 is in an on-state, the multiple voltage detector circuit operates as an adder circuit. That is, a voltage which is the voltage between two points (between the connection point (2) and connection point (4)) pertaining to the other connection point (2) added to the voltage between the above-mentioned two points (between the connection point (3) and connection point (4)) is output. This is an example wherein the voltage between the above-mentioned two points (the result of the addition) itself becomes the output voltage, but this example is not limiting. In any case, when the switch (SW) 35 is in an on-state, the multiple voltage detector circuit generates and outputs an output voltage in accordance with a voltage which is the voltage between the other two points added to the voltage between the above-mentioned two points. The output voltage of the multiple voltage detector circuit is A/D (analog to digital) converted in the A/D converter 36, and input into the CPU 37.

Not necessarily being limited to an "added voltage", the kind of configuration in FIG. 4, to be described hereafter, may, for example, be adopted.

The A/D converter 36 converts the output voltage (analog) of the multiple voltage detector circuit into a digital output voltage, and outputs the output voltage to the CPU 37 (15). That is, the output voltage of the multiple voltage detector circuit is input (converted into digital) into the CPU 37 (15). In the following description, no detailed mention will be made of the conversion into digital.

Herein, the CPU 37 (15) controls the turning on and off of the switch (SW) 35, thus obtaining the output voltage of the multiple voltage detector circuit when the switch (SW) 35 is in an off-state and the output voltage of the multiple voltage detector circuit when the switch (SW) 35 is in an on-state. Further, the CPU 37 (15) determines whether or not there is a failure of the direct current intermediate voltage detector 11 based on these two kinds of output voltage value.

The configuration shown in FIG. 2 is such that, when the resistance values of all the resistor circuits 31 configuring the voltage divider circuit 30 are the same, the voltage between the connection point (2) and connection point (4) is of a value 1.5 times that of the voltage between the connection point (3) and connection point (4). Also, as heretofore described, the value of the output voltage of the multiple voltage detector circuit when the switch (SW) 35 is in an off-state is a value in accordance with "the voltage between the connection point (3) and connection point (4)". The value of the output voltage of the multiple voltage detector circuit when the switch (SW) 35 is in an on-state is a value in accordance with "the voltage between the connection point (3) and connection point (4)+the voltage between the connection point (2) and connection point (4)". Therefore, the value of the output voltage of the multiple voltage detector circuit (the value detected by the A/D converter 36; the value read into the CPU 37 (15)) when the switch 35 is in an on-state is a value 2.5 times that when the switch 35 is in an off-state.

Consequently, calculating the ratio between the heretofore described two kinds of output voltage value, conditions can be seen as being normal when the ratio is approximately 2.5. In the process example of FIG. 3, to be described hereafter, by providing some margin with respect to 2.5, the ratio between the two kinds of output voltage value is determined to be normal when within a range of "2.4 to 2.6". Of course, it being sufficient that the margin is set as appropriate, it may be, for example, "2.45 to 2.55" or the like.

Of course, the numerical value "2.5" is a value in accordance with the conditions of the direct current intermediate voltage detector 11 being of the configuration shown in FIG. 2 and the resistance values of all the resistor circuits 31 being the same, as heretofore described, and when the configuration or conditions change, the numerical value naturally changes accordingly. In any case, the ratio between the two kinds of output voltage value (this will be referred to as the detected value ratio) when normal is calculated, and whether or not there is a failure is determined based on the detected value ratio. However, "ratio" not being limiting, the determination may also be based on, for example, "difference" or the like.

Also, in the heretofore described example, the ratio (or difference) between two kinds of output voltage value is used but, this example not being limiting, a configuration wherein the ratios (or differences) between three or more kinds of output voltage value are used may be adopted. Of course, the connection points in the voltage divider circuit 30 increase accordingly. Therefore, the configuration becomes commensurately more complex (furthermore, the process of determining whether or not there is a failure also becomes more complex). Because of this, a configuration wherein two kinds of output voltage value are used is desirable.

Herein, failures that can be distinguished using this method are a failure in one portion of the configuration of the voltage divider circuit 30, a failure or some disconnection in the operational amplifier 38, and a failure in the A/D converter 36. A failure in one portion of the configuration of the voltage divider circuit 30 refers to a disconnection or short circuit in the resistor circuits 31 (a resistor thereof) between the connection point (2) and connection point (4).

However, consideration is not given here to distinguishing which of these kinds of failure has occurred (although there may be failures that can be distinguished). When one of these kinds of failure occurs, the occurrence of the failure can be detected by the determination in step S15 or S25 in the process of FIG. 3 or FIG. 5, to be described hereafter, being NO.

For example, with regard to a failure in one portion of the configuration of the voltage divider circuit 30, the following kinds of failure are conceivable in the example of FIG. 2, and in a case wherein the detected value ratio at the heretofore described kind of normal time is 2.5, the detected value ratio when each failure occurs is as below.

Failure Details: Detected Value Ratio

Disconnection of one resistor of circuit 31 between connection points (2) and (3): 3 times. Short circuit of one resistor of circuit 31 between connection points (2) and (3): 2 times. Disconnection of one resistor of circuit 31 between connection points (3) and (4): 2.3 times. Short circuit of one resistor of circuit 31 between connection points (3) and (4): 3 times. Also, regarding a failure or some disconnection of the operational amplifier 38 and a failure of the A/D converter 36, basically, in the event of the kind of failure wherein the two kinds of output voltage value output from the A/D converter 36 are the same, the occurrence of a relevant failure can be distinguished. In other words, as this method is such that measurement is carried out twice (and as the configuration is such that the results of the two measurements differ when normal), it can be determined that there is trouble when the results of the two measurements are the same. The kind of failure wherein, for example, the A/D converter 36 outputs only the same output regardless of the input value is known as one example of a failure of the A/D converter 36. Alternatively, a failure wherein the output of the operational amplifier is 0 or fixed at the power supply voltage (5V or the like) is known. In the case of this kind of failure, for example, it is possible to distinguish using this method.

The CPU 37 (15) carries out a determination of whether or not there is a failure by executing, for example, the processes of FIG. 3. Hereafter, a description will be given of the processes of FIG. 3.

The CPU 37 (15) executes the processes of FIG. 3 in, for example, a fixed cycle.

At the start of the processes of FIG. 3, the switch (SW) 35 is in an off-state owing to the process of step S14 during the previous execution of the processes of FIG. 3. In this state, the CPU 37 (15) reads the output of the A/D converter 36 (taken to be the output voltage value #1) (step S11). In the case of this embodiment, this means that the CPU 37 (15) reads an output voltage value in accordance with the voltage between the above-mentioned two points (between the connection point (3) and connection point (4)).

Next, the switch (SW) 35 is switched to an on-state (step S12), and the CPU 37 (15) reads the output of the A/D converter 36 (referred to as output voltage value #2) in this state (step S13). In the case of this embodiment, this means that the CPU 37 (15) reads an output voltage value in accordance with a voltage that is the two inter-point voltages added together (the voltage between the connection point (3) and connection point (4)+the voltage between the connection point (2) and connection point (4)).

Further, for example, after the switch (SW) 35 is returned to the initial state (off-state) (step S14), the CPU 37 (15) determines whether or not there is a failure based on the two kinds of output voltage value (#1 and #2) read in and a preset predetermined value (predetermined range) relating to the detected value ratio (step S15). That is, firstly, the detected value ratio is obtained. This is calculated by detected value ratio=output voltage value #2/output voltage value #1.

Then, by determining whether or not the calculated detected value ratio is within the predetermined range, the CPU 37 (15) determines whether or not there is a failure. Herein, the predetermined range is taken to be "2.4 to 2.6", because of which the CPU 37 (15) determines whether or not the condition "2.4<detected value ratio<2.6" is satisfied. Conditions can be seen as normal when the condition is satisfied, and it can be seen that there is a failure when the condition is not satisfied. As previously described, determining that there is a failure means determining that trouble has occurred somewhere in the direct current intermediate voltage detector 11, but does not identify where the failure is located.

If it is determined by the determination process of step S15 that there is a failure (if the condition is not satisfied) (NO in step S15), a process of stopping the voltage output is executed (step S17). By so doing, the converter output voltage (direct current intermediate voltage) is prevented in advance from rising to or above the upper limit value (exceeding the breakdown voltage of the IGBT 9 or the like). The process of stopping the voltage output is, for example, a process that stops the device by stopping the switching operation of the IGBT 9, or the like, or alternatively, when not stopping the device, a process of supplying direct current voltage at the power supply voltage level as it is, without boosting, to the inverter 2 (direct drive). Also, in step S17, furthermore, an unshown upstream device, or the like, may be notified of the occurrence of trouble.

Meanwhile, if it is determined by the determination process of step S15 that conditions are normal (if the condition is satisfied) (YES in step S15), the process of step S16 is executed.

Hereafter, a description will be given of the process of step S16.

In step S16, firstly, the voltage across the direct current intermediate voltage capacitor 10 (the direct current intermediate voltage) Edc is calculated (by CPU 37 (see FIG. 2), acting as a direct current intermediate voltage value detection device) using either one of the two kinds of output voltage value (herein, the output voltage value #1). With the configuration of FIG. 2, when the output voltage value #1, provisionally, is 2.01(V) in the heretofore described example (100 resistor circuits 31 of the same resistance value), Edc is calculated as follows. As the output voltage value #1 is the voltage applied to the two resistor circuits 31 between the connection points (3) and (4), Edc is calculated as 2.01× (100/2)=2.01×50=100.5(V).

In step S16, furthermore, the difference between the calculated direct current intermediate voltage Edc and the command voltage value (Edc*) is obtained, and input into the voltage control unit (AVR) 21. This process is the operation of the adder-subtractor 24 (in the embodiment, the adder-subtractor 24 is also taken to be one portion of the functions of the CPU 37, but this example is not limiting).

In the heretofore described example, the detected value ratio (=the output voltage value #2/the output voltage value #1) is used but, the example not being limiting, the increase amount (difference=the output voltage value #2−the output voltage value #1), for example, may be used. In this case, naturally, the numerical values used in the determination of step S15 differ from those in the heretofore described example (2.4 to 2.6) (as the numerical values are set as appropriate, no particular indication thereof will be made here).

In the event of a short circuit failure of a resistor of the resistor circuits 31 between (1) and (2) shown in FIG. 2, or a short circuit failure of a resistor of the resistor circuits 31 between (4) and (5), the detected voltage value of the direct current intermediate voltage Edc is higher than the actual value. That is, the direct current intermediate voltage Edc is erroneously controlled so as to be lower than the target value (for example, 100V). Therefore, in this case, no failure of the IGBT element is caused, even when output drops.

Meanwhile, in the event of a disconnection failure of a resistor of the resistor circuits 31 between (1) and (2) shown in FIG. 2, or a disconnection failure of a resistor of the resistor circuits 31 between (4) and (5), the detected voltage value of the direct current intermediate voltage Edc is lower than the actual value. However, by adopting a high number of series connections, it is possible to suppress the size of a voltage detection error caused by a disconnection failure of a resistor, preventing serious damage that leads to element failure.

Figure 5:
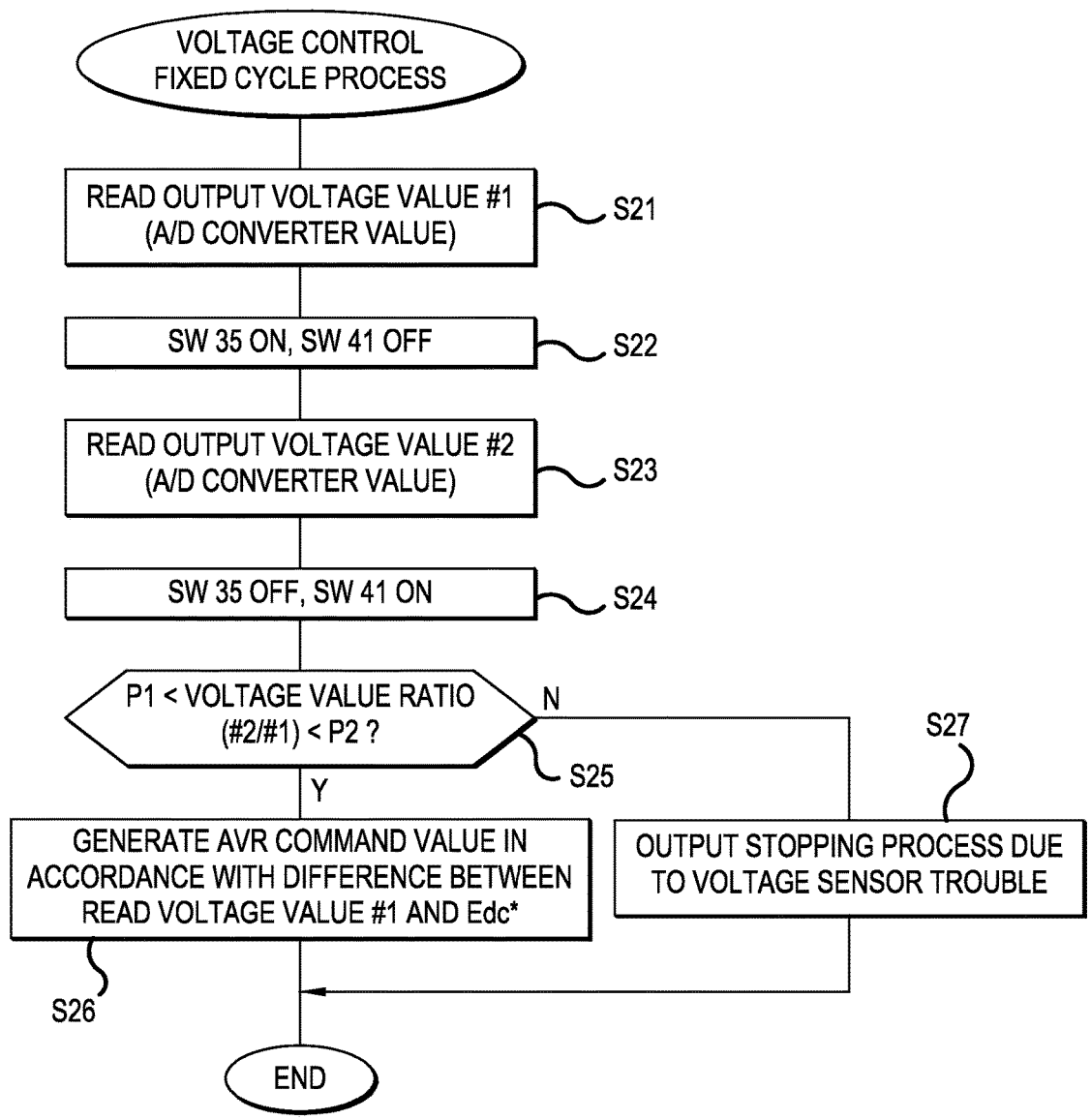
FIG. 5 is a process flow chart of the control unit (modification example).

Heretofore, a description has been given of the direct current intermediate voltage detector 11 and control unit 15 shown in FIG. 2 and FIG. 3, but this example not being limiting, as previously mentioned, the example shown in FIG. 4 and FIG. 5 (modification example), for example, may be adopted. Hereafter, a description will be given of the modification example.

FIG. 4 is a configuration example (modification example) of the direct current intermediate voltage detector 11.

FIG. 5 is a process flow chart of the control unit 15 of the modification example.

Hereafter, firstly, a description will be given of FIG. 4, but the same reference numbers are given to configurations in FIG. 4 practically the same as configurations in FIG. 2, and a description thereof will be simplified or omitted. From this, a difference from FIG. 2 is that a switch (SW) 41 is also provided for the connection point (3), as shown in FIG. 4. That is, in FIG. 2, the switch (SW) 35 is provided for the connection point (2), but in FIG. 4, the switch (SW) 41 is further provided for the connection point (3).

Further, basically, a CPU 42 (15) controls the turning on and off of the switches so that when one is in an on-state, the other is in an off-state. Also, the CPU 42 basically carries out practically the same processes as the CPU 37, but as the control of the turning on and off of the switches differs from the CPU 37, the CPU 42 is given a different reference sign (42, not 37).

Further, the CPU 42 executes, for example, the processes shown in FIG. 5.

The processes of FIG. 5, in the same way as the processes of FIG. 3, are executed in a fixed cycle. Further, at the start of the processes, the switch 41 is in an on-state and the switch 35 in an off-state owing to the process of step S24 during the previous execution of the processes of FIG. 5. Further, in this state, the CPU 42 reads the output of the A/D converter 36 (taken to be the output voltage value #1) (step S21), in the same way as in step S11. This means that the CPU 42 reads an output voltage value of the multiple voltage detector circuit in accordance with the voltage between the connection points (3) and (4), in the same way as in step S11.

Continuing, by carrying out control switching the two switches to on or off, the CPU 42 switches the switch 41 to an off-state and the switch 35 to an on-state (step S22). Further, in this state, the CPU 42 reads the output of the A/D converter 36 (taken to be the output voltage value #2) (step S23), in practically the same way as in step S13. This, however, differing from step S13, means that the CPU 42 reads the output voltage value of the multiple voltage detector circuit in accordance with the voltage between the connection points (2) and (4).

In this way, the example shown in FIG. 2 and FIG. 3 and the example shown in FIG. 4 and FIG. 5 are both the same in that measurement (reading of the output voltage value of the multiple voltage detector circuit) is carried out twice, based on the voltage between two arbitrary points in the voltage divider circuit 30. Also, the first measurement is also the same. That is, in both cases, an output voltage value in accordance with the voltage between one pair of points (between the connection points (3) and (4)) of the heretofore mentioned two pairs of points is read the first time. It is the second measurement that is different, as in the example of FIG. 2 and FIG. 3, an output voltage value in accordance with a voltage that is the voltage between one pair of points of the heretofore mentioned two pairs of points added to the voltage between the other pair of points is read. Meanwhile, in the example of FIG. 4 and FIG. 5, an output voltage value in accordance with the voltage between the other pair of points (between the connection points (2) and (4)) is read in the second measurement.

In either case, whether or not there is trouble is determined based on the ratio or difference between the first detection result and second detection result, and on a preset predetermined value (predetermined range or the like).

In the embodiment, the process of step S25 is carried out. In this process, the detected value ratio is calculated by detected value ratio=output voltage value #2/output voltage value #1.

Further, by determining whether or not the detected value ratio is within the predetermined range, the CPU 42 determines whether or not there is a failure. In the example shown in the drawing, unlike that in FIG. 3, the predetermined range is taken to be "p1 to p2", without indicating specific numerical values, but of course p1<p2, and numerical values are set so that the detected value ratio is within the predetermined range when conditions are normal.

From the above, the CPU 42 determines whether or not the condition "p1<detected value ratio<p2" is satisfied, wherein conditions can be seen as normal when the condition is satisfied, and it can be seen that there is a failure when the condition is not satisfied.

If it is determined by the determination process of step S25 that there is a failure (if the condition is not satisfied) (NO in step S25), the process of step S27 is executed. As step S27 is the same as step S17, no description will be given here.

Meanwhile, if it is determined by the determination process of step S25 that conditions are normal (if the condition is satisfied) (YES in step S25), the process of step S26 is executed. As step S26 is the same as step S16, no description will be given here.

Heretofore, referring to FIG. 2 to FIG. 5, a description has been given showing an example, modification example, and the like, of this method, but these examples are not limiting. For example, FIG. 2 and FIG. 4 are both of a configuration wherein two arbitrary places (between two pairs of points) in the voltage divider circuit 30 are connected to the input side of the operational amplifier 38, and one portion of the regions between the two pairs of points is overlapping. That is, the region between the connection points (3) and (4) is included in the region between the connection points (2) and (4).

This is useful in simplifying the configuration because, by adopting a configuration with regard to the regions between the two pairs of points such that the connection point connected to the positive terminal of the operational amplifier is shared (it is the connection point (4)), there is no need to provide a switch for the connection point (4) (and furthermore, the number of connection points related to the positive terminal decreases). Naturally, however, this example not being limiting, a configuration wherein two connection points are connected via switches to the positive terminal of the operational amplifier may be adopted. Therefore, the regions between the two pairs of points not being limited to a configuration wherein one portion is overlapping, the regions between the two pairs of points may be configured so as to be completely separate.

As heretofore described, the examples of FIG. 2 to FIG. 5 not being limiting, various configurations are conceivable, but in any case, it can be said that the power conversion system of the embodiment has, for example, the following configuration.

That is, the power conversion system of the embodiment has a converter that generates direct current power from a power supply, an inverter that drives a load based on the direct current power, and a voltage detection device that detects the voltage value of a direct current intermediate voltage between the converter and inverter, and has the following configuration.

The voltage detection device has the direct current intermediate voltage detector 11, control unit 15 (CPU 37, 42), and the like, and has the following configurations.

The voltage divider circuit 30, wherein the direct current intermediate voltage Edc is applied, a plurality of the resistor circuit 31 in which a plurality of resistors are connected in parallel are connected in series, and the direct current intermediate voltage Edc is divided by the plurality of resistor circuits 31:

and a multiple voltage detector circuit (formed of the operational amplifier 38, switches 35 and 41, and the like), connected to a plurality of arbitrary places in the voltage divider circuit 30, that can selectively output a plurality of kinds of voltage value in accordance with the voltage of the plurality of places in the voltage divider circuit 30:

wherein "selectively" is realized by, for example, controlling the turning on and off of the switch 35, switch 41, or the like.

A trouble determination unit that, based on the plurality of kinds of voltage value (for example, the output voltage value #1 and output voltage value #2) output in temporal sequence from the multiple voltage detector circuit and on a preset predetermined value (a predetermined range or the like), carries out trouble determination for the relevant voltage detector device (the direct current intermediate voltage detector 11 thereof):

wherein "output in temporal sequence" means that, for example, the output voltage value #1 is output first, after which the output voltage value #2 is output, and the like.

A direct current intermediate voltage value detection unit that, when it is determined by the trouble determination unit that conditions are normal, obtains the direct current intermediate voltage value using one of the plurality of kinds of voltage value:

wherein the trouble determination unit and direct current intermediate voltage value detection unit are functions executed by, for example, the control unit 15 (CPU 37, 42) or the like.

According to the power conversion system, the following advantages, for example, are obtained.

That is, according to this method, the power conversion device is such that it is possible, with a simple configuration, to immediately detect a failure in an output voltage detector circuit that detects voltage (direct current intermediate voltage) between a converter and inverter in a power conversion system. This is particularly configured so that it is possible to immediately detect a failure state such that the value of an output voltage (direct current intermediate voltage) is detected as being lower than the actual voltage. Because of this, it is possible to prevent the occurrence of a serious failure such as the destruction of a power conversion element (particularly an IGBT or the like) caused by the converter outputting a high voltage due to a failure of the output voltage detector circuit. Also, it is possible to detect a failure using a simple configuration, without increasing circuit scale as with an overlapping of voltage detector circuits.

In this way, the invention relates to a power conversion system having a converter that converts alternating current or direct current voltage into direct current voltage, and is configured so that, even when there is a failure in a direct current intermediate voltage detection unit that detects the value of a direct current intermediate voltage for controlling the direct current output voltage of the converter, this does not lead to a serious failure of the device.

Also, the invention is such that, in order to detect a failure of the direct current intermediate voltage detection unit, a voltage divider circuit in the direct current intermediate voltage detection unit is configured of a plurality of parallel resistor circuits connected in series. By adopting this kind of configuration, it is possible to detect a failure of the voltage divider circuit, or the like, by confirming the ratio, difference, or the like, between two kinds of voltage value obtained based on the voltage of at least two voltage dividing points every time the detected voltage value is read.

According to the power conversion system of the invention, the voltage detection device thereof, and the like, the power conversion system is such that, even when there is a failure in the voltage detection device that detects the value of the output voltage of the converter unit, it is possible to immediately detect the failure with a simple configuration, and thus possible to prevent a situation wherein an element is destroyed.

What is claimed is:

1. A power conversion system comprising a converter that generates direct current power from a power supply, an inverter that drives a load based on the direct current power, and a voltage detection device that detects the voltage value of a direct current intermediate voltage between the converter and inverter, the voltage detection device comprising:
 a voltage divider circuit, wherein the direct current intermediate voltage is applied to the voltage divider circuit, a plurality of resistor circuits are connected in series, each of the plurality of resistor circuits including a plurality of resistors connected in parallel, and the direct current intermediate voltage is divided by the plurality of resistor circuits;
 a multiple voltage detector circuit, connected to a plurality of arbitrary places in the voltage divider circuit, that can selectively output, by selectively operating at least one switch, a plurality of kinds of voltage value in accordance with the voltage of the plurality of places in the voltage divider circuit;
 a trouble determination device that, based on the plurality of kinds of voltage value output in temporal sequence from the multiple voltage detector circuit and on a preset predetermined value, carries out trouble determination for the voltage detector device; and
 a direct current intermediate voltage value detection device that, when it is determined by the trouble determination device that conditions are normal, obtains the direct current intermediate voltage value using one of the plurality of kinds of voltage value,
 wherein
 the multiple voltage detector circuit includes an operational amplifier,
 two arbitrary points in the voltage divider circuit are connected to the input side of the operational amplifier, and furthermore, one other arbitrary point is connected via a switch to the input side of the operational amplifier, and
 the plurality of kinds of voltage value include two kinds of voltage value, the two kinds of voltage value including an output voltage value when the switch is in an off-state and an output voltage value when the switch is in an on-state.

2. The power conversion system according to claim 1, wherein the trouble determination device obtains the ratio or difference between the plurality of kinds of voltage value, and determines that conditions are normal when the ratio or difference is within a preset predetermined range.

3. The power conversion system according to claim 1, wherein the two kinds of output voltage value are an output voltage value in accordance with the voltage value between two arbitrary points in the voltage divider circuit and an output voltage value in accordance with an additional value that is the voltage value between the two arbitrary points added to the voltage value between another two arbitrary points.

4. The power conversion system according to claim 1, wherein
each of the resistor circuits is of a configuration wherein two resistors are connected in parallel.

5. The power conversion system according to claim 1, wherein
the multiple voltage detector circuit further has an A/D converter circuit that converts the output voltage of the operational amplifier from analog to digital, and
the trouble determination device determines a trouble condition to exist when short circuit or disconnection trouble occurs in a resistor of the resistor circuits related to each connection place in the voltage divider circuit, or when arbitrary trouble occurs in either the operational amplifier or A/D converter circuit.

6. The power conversion system according to claim 1, further comprising:
a trouble processing device that, when it is determined by the trouble determination device that there is trouble, controls the converter to stop generation of the direct current voltage, or notifies an upstream device of the occurrence of trouble.

7. The power conversion system according to claim 1, further comprising:
a converter control device that, based on the voltage value of the direct current intermediate voltage detected by the voltage detection device, controls the value of the direct current voltage generated by the converter.

8. The power conversion system according to claim 1, wherein the converter has a plurality of IGBTs as a configuration for returning regenerative power derived from braking of the load to the power supply.

9. A power conversion system comprising a converter that generates direct current power from a power supply, an inverter that drives a load based on the direct current power, and a voltage detection device that detects the voltage value of a direct current intermediate voltage between the converter and inverter,
the voltage detection device comprising:
a voltage divider circuit, wherein the direct current intermediate voltage is applied to the voltage divider circuit, a plurality of resistor circuits are connected in series, each of the plurality of resistor circuits including a plurality of resistors connected in parallel, and the direct current intermediate voltage is divided by the plurality of resistor circuits;
a multiple voltage detector circuit, connected to a plurality of arbitrary places in the voltage divider circuit, that can selectively output, by selectively operating at least one switch, a plurality of kinds of voltage value in accordance with the voltage of the plurality of places in the voltage divider circuit;
a trouble determination device that, based on the plurality of kinds of voltage value output in temporal sequence from the multiple voltage detector circuit and on a preset predetermined value, carries out trouble determination for the voltage detector device; and
a direct current intermediate voltage value detection device that, when it is determined by the trouble determination device that conditions are normal, obtains the direct current intermediate voltage value using one of the plurality of kinds of voltage value, wherein
the plurality of kinds of voltage value include two kinds of output voltage value,
the two kinds of output voltage value are an output voltage value in accordance with the voltage value between two arbitrary points in the voltage divider circuit and an output voltage value in accordance with the voltage value between another two arbitrary points in the voltage divider circuit
the multiple voltage detector circuit includes an operational amplifier,
two arbitrary points in the voltage divider circuit are connected to the input side of the operational amplifier, and furthermore, another two arbitrary points are connected via another switch to the input side of the operational amplifier, and
by controlling the turning on and off of each switch, an output voltage value in accordance with the voltage value between the two arbitrary points is caused to be output, and continuing, an output voltage value in accordance with the voltage value between the other two arbitrary points is caused to be output, in temporal sequence from the multiple voltage detector circuit.

10. A voltage detection device in a power conversion system comprising a converter that generates direct current power from a power supply, an inverter that drives a load based on the direct current power, and a voltage detection device that detects the voltage value of a direct current intermediate voltage between the converter and inverter,
the voltage detection device comprising:
a voltage divider circuit, wherein the direct current intermediate voltage is applied to the voltage divider circuit, a plurality of resistor circuits are connected in series, each of the plurality of resistor circuits including a plurality of resistors connected in parallel, and the direct current intermediate voltage is divided by the plurality of resistor circuits;
a multiple voltage detector circuit, connected to a plurality of arbitrary places in the voltage divider circuit, that can selectively output, by selectively operating at least one switch, a plurality of kinds of voltage value in accordance with the voltage of the plurality of places in the voltage divider circuit;
a trouble determination device that, based on the plurality of kinds of voltage value output in temporal sequence from the multiple voltage detector circuit and on a preset predetermined value, carries out trouble determination for the voltage detector device; and
a direct current intermediate voltage value detection device that, when it is determined by the trouble determination device that conditions are normal, obtains the direct current intermediate voltage value using one of the plurality of kinds of voltage value, wherein
the multiple voltage detector circuit includes an operational amplifier,
two arbitrary points in the voltage divider circuit are connected to the input side of the operational amplifier, and furthermore, one other arbitrary point is connected via a switch to the input side of the operational amplifier, and the plurality of kinds of voltage value include two kinds of voltage value, the two kinds of voltage value including an output voltage value when the switch is in an off-state and an output voltage value when the switch is in an on-state.

\* \* \* \* \*